(12) United States Patent
Old

(10) Patent No.: US 10,727,873 B1
(45) Date of Patent: Jul. 28, 2020

(54) SYSTEM AND METHOD FOR SUCCESSIVE CANCELLATION LIST DECODING OF POLAR CODES

(71) Applicant: Xilinx, Inc., San Jose, CA (US)

(72) Inventor: Gordon I. Old, Edinburgh (GB)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/373,434

(22) Filed: Apr. 2, 2019

(51) Int. Cl.
*H03M 13/37* (2006.01)
*G06F 11/10* (2006.01)
*G11C 29/52* (2006.01)
*H03M 13/13* (2006.01)

(52) U.S. Cl.
CPC ......... *H03M 13/37* (2013.01); *G06F 11/1068* (2013.01); *G11C 29/52* (2013.01); *H03M 13/13* (2013.01)

(58) Field of Classification Search
CPC ... H03M 13/37; H03M 13/13; G06F 11/1068; G11C 29/52
See application file for complete search history.

(56) References Cited

U.S. PATENT DOCUMENTS

| | | | | |
|---|---|---|---|---|
| 2005/0105658 A1* | 5/2005 | Haratsch | ............. | H04L 25/4917 375/348 |
| 2005/0264906 A1* | 12/2005 | Haratsch | ................ | G11B 20/18 360/39 |
| 2005/0265492 A1* | 12/2005 | Haratsch | .......... | G11B 20/10009 375/341 |
| 2005/0268211 A1* | 12/2005 | Haratsch | ........... | H04L 25/03235 714/796 |
| 2007/0076824 A1* | 4/2007 | Graef | ................ | H03M 13/6331 375/341 |
| 2007/0079225 A1* | 4/2007 | Graef | ................ | H03M 13/4184 714/795 |
| 2017/0149531 A1* | 5/2017 | Raza | ....................... | G06F 11/10 |
| 2018/0062671 A1* | 3/2018 | Cherubini | ............... | H04L 1/006 |
| 2018/0076831 A1* | 3/2018 | Hamelin | ............. | H03M 13/157 |

(Continued)

OTHER PUBLICATIONS

Wu, Xi., et al., "Performance Analysis of SCMA System Based on Polar Codes", 2018 IEEE Globecom Workshops, IEEE, Conference Location: Abu Dhabi, United Arab Emirates, Date of Conference: Dec. 9-13, 2018, pp. 1-5. (Year: 2018).*

(Continued)

*Primary Examiner* — Kyle Vallecillo
(74) *Attorney, Agent, or Firm* — Haynes and Boone, LLP

(57) ABSTRACT

A decoder circuit includes an input configured to receive an encoded message, and a decoding loop circuit including first and second memories, an update circuit, and a sort circuit. The decoding loop circuit is configured to perform list decoding to the encoded message by successively decoding a plurality of bits of a first codeword of the encoded message in a plurality of decoding loops respectively; and provide, to an output, a decoded message. In each decoding loop, the update circuit is configured to receive, from the first memory, parent path values, and provide, to a second memory, child path values based on the parent path values. The sort circuit is configured to receive, from the second memory, the child path values; and provide, to the first memory, surviving child path values based on the child path values.

20 Claims, 6 Drawing Sheets

(56) References Cited

U.S. PATENT DOCUMENTS

2019/0287011 A1* 9/2019 Yuksel .............. H03M 13/3961

OTHER PUBLICATIONS

Balatsoukas-Stimming, Alexios et al., "LLR-Based Successive Cancellation List Decoding of Polar Codes", IEEE Transactions on Signal Processing, Sep. 2014, Revised Mar. 6, 2015, pp. 1-15, IEEE, Piscataway, New Jersey, USA.
Arikan, Erdal, Channel Polarization: A Method for Constructing Capacity—Achieving Codes for Symmetric Binary-Input Memoryless Channels, IEEE Transactions on Information Theory, Jul. 2009, pp. 1-23, vol. 55, Issue 7, Jul. 2009, IEEE, Piscataway, New Jersey, USA.

* cited by examiner

SYSTEM AND METHOD FOR SUCCESSIVE CANCELLATION LIST DECODING OF POLAR CODES

TECHNICAL FIELD

Examples of the present disclosure generally relate to integrated circuits ("ICs") and, in particular, to embodiments related to successive cancellation list (SCL) decoding of polar codes.

BACKGROUND

Polar codes are alternative Forward Error Correction (FEC) codes similar to Turbo codes or Low Density Parity Check (LDPC) codes. A polar code is a linear block error correcting code, and the code construction is based on a multiple recursive concatenation of a short kernel code which transforms the physical channel into virtual outer channels. When the number of recursions becomes large, the virtual channels tend to either have high reliability or low reliability (in other words, they polarize), and the data bits are allocated to the most reliable channels. Typically, list decoding of polar codes has high latency and leads to inefficient use of the hardware. Therefore, there is a need for a polar code decoder providing high throughput and efficient use of the hardware.

SUMMARY

In some embodiments in accordance with the present disclosure, a decoder A decoder circuit includes an input configured to receive an encoded message and a decoding loop circuit including first and second memories, an update circuit, and a sort circuit. The decoding loop circuit is configured to: perform list decoding to the encoded message by successively decoding a plurality of bits of a first codeword of the encoded message in a plurality of decoding loops respectively; and provide, to an output, a decoded message based on at least one of the surviving child path values. In each decoding loop for a corresponding bit of the first codeword, the update circuit is configured to: receive, from the first memory, a plurality of parent path values; and provide, to a second memory, a plurality of child path values based on the plurality of parent path values. Also, in each decoding loop, the sort circuit is configured to: receive, from the second memory, the plurality of child path values; and provide, to the first memory, a plurality of surviving child path values based on the plurality of child path values.

In some embodiments, the first memory has a first size that is different from a second size of the second memory.

In some embodiments, each of the first and second memories include one or more random access memory blocks (BRAMs) in a programmable logic device.

In some embodiments, the first memory includes a first type of random access memory (RAM), and the second memory includes a second type of random access memory that is different from the first type.

In some embodiments, the decoding loop circuit is configured to decode a plurality of interlaced codewords of the encoded message.

In some embodiments, the encoded message is generated based on a polar code.

In some embodiments, the list decoding is successive cancellation list decoding.

In some embodiments, the plurality of child path values include corresponding path metrics for each path.

In some embodiments, the first memory includes a read data port directly connected to an input of the update circuit.

In some embodiments, the first memory includes a write data port directly connected to an output of a multiplexer controlled by the sort circuit.

In some embodiments, the second memory includes a write data port directly connected to an output of the update circuit.

In some embodiments, the second memory includes a read data port directly connected to an input of a multiplexer controlled by the sort circuit.

In some embodiments, a method includes receiving an encoded message; performing list decoding of the encoded message by successively decoding a plurality of bits of a first codeword of the encoded message in a plurality of decoding loops respectively. Each decoding loop for a corresponding bit of the first codeword includes: receiving, by an update circuit from a first memory, a plurality of parent path values; providing, by the update circuit to a second memory, a plurality of child path values based on the plurality of parent path values; receiving, by a sort circuit from the second memory, the plurality of child path values; and providing, by the sort circuit to the first memory, a plurality of surviving child path values based on the plurality of child path values. The method further includes providing, to an output, a decoded message based on at least one of the surviving child path values.

In some embodiments, the method includes generating a plurality of interlaced codewords of the encoded message; and performing the list decoding to the plurality of interlaced codewords.

In some embodiments, the update circuit receives the plurality of parent path values from the first memory using a read data port of the first memory directly connected to an input of the update circuit, and the sort circuit provides the third plurality of surviving child path values to the first memory using a write data port of the first memory directly connected to an output of the sort circuit.

In some embodiments, the update circuit provides the plurality of child path values to the second memory using a write data port of the second memory directly connected to an output of the update circuit, and the sort circuit receives the plurality of child path values from the second memory using a read data port of the second memory directly connected to an input of the sort circuit.

DETAILED DESCRIPTION

Figure 1:
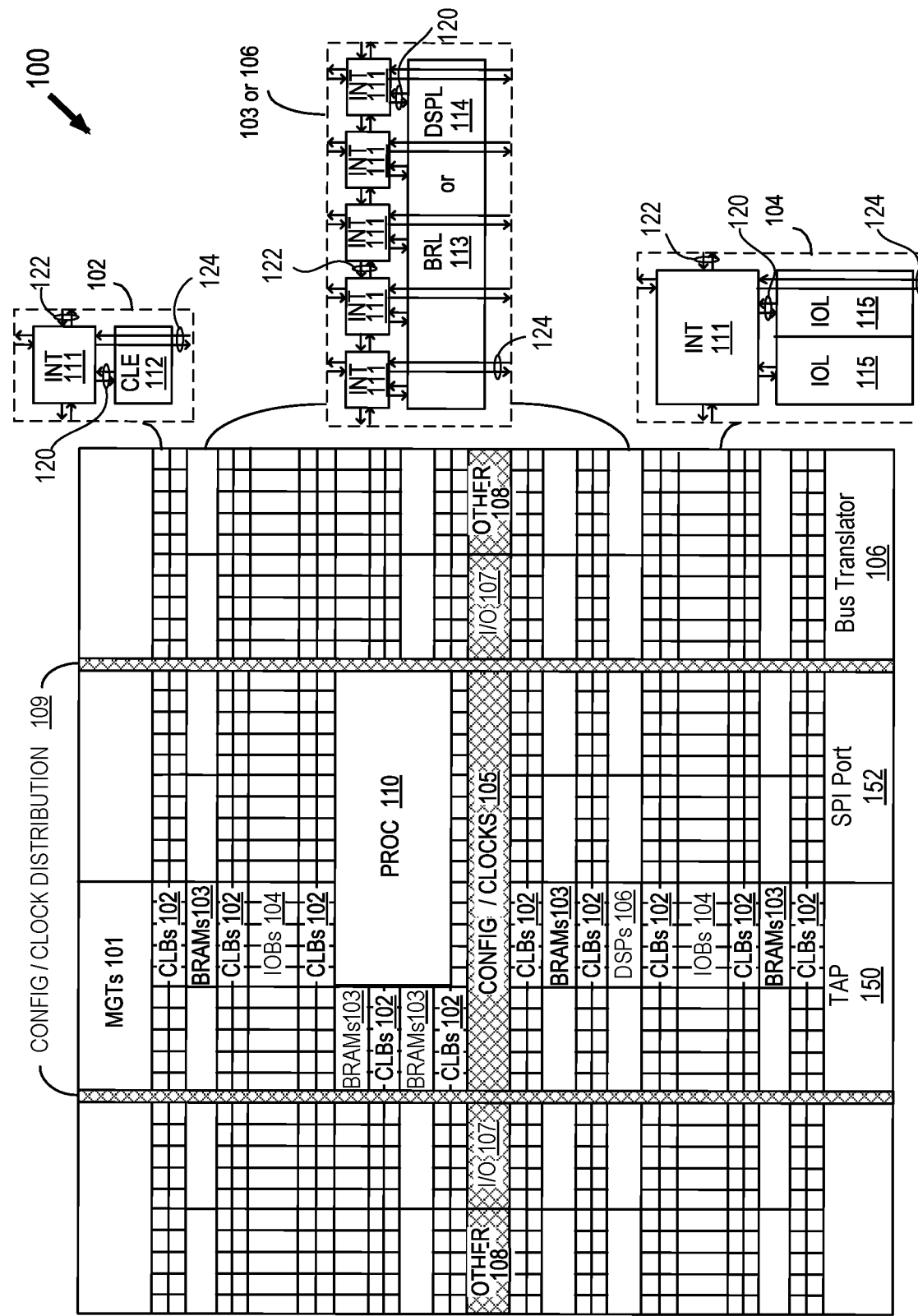
FIG. 1 is a block diagram illustrating an exemplary architecture for an IC according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding.

As discussed above, there is a need for an improved polar code decoder, which provides high throughput and efficient use of the hardware. To decode a received encoded polar code data message, a successive cancellation list decoder (SCL) may be used. In such a list decoder, a list of a particular size L may be used to track multiple paths corresponding to candidate decoded codewords. As the decoding proceeds with a subsequent bit in a particular encoded codeword, new paths form, and a sort-and-cull operation is used to maintain a list of the L most probable paths. Memories (e.g., with pointers for read and write addresses) may be used to store and track data associated with each path. For a given data element stored in a pointer memory, there are typically two operations: an update process to update that data element at the same memory location (e.g., as a result of an update stage of the SCL), a re-order/copy process to store that data element at another memory location (e.g., as a result of a sort stage of the SCL). Further, in embodiments where such a list decoder implements interlacing of codewords to improve throughput, there may be multiple simultaneous accesses to data elements stored in a memory. While a common implementation of a memory system to allow for such accesses is using a single register array, the access to and from such a register array is expensive in terms of multiplexing.

An SCL decoder for polar codes typically requires several stages (e.g., an update stage, a sort stage) in a single decoding loop for processing each bit of the codeword, which leads to high latency and inefficient use of the storage system and other hardware elements. Furthermore, in some embodiments, multiple codewords are interlaced to follow one another through the stages of a decoding loop. Such a combination of multiple paths, multiple codewords, and multiple stages within a decoder loop operating on a common memory (e.g., a single register array) leads to a large resource cost for the access multiplexers for that common memory.

It has been discovered that by using a storage system with two separate memories in an SCL decoder for polar codes, the resource cost for multiplexing is reduced, and a more efficient storage system for the SCL decoder is achieved.

With the above general understanding borne in mind, various embodiments for an SCL decoder of Polar codes are described below.

Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or complex programmable logic devices (CPLDs). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may implement the decoder is not limited to the exemplary IC depicted in FIG. 1, and that IC having other configurations, or other types of IC, may also implement the decoder.

Figure 2:
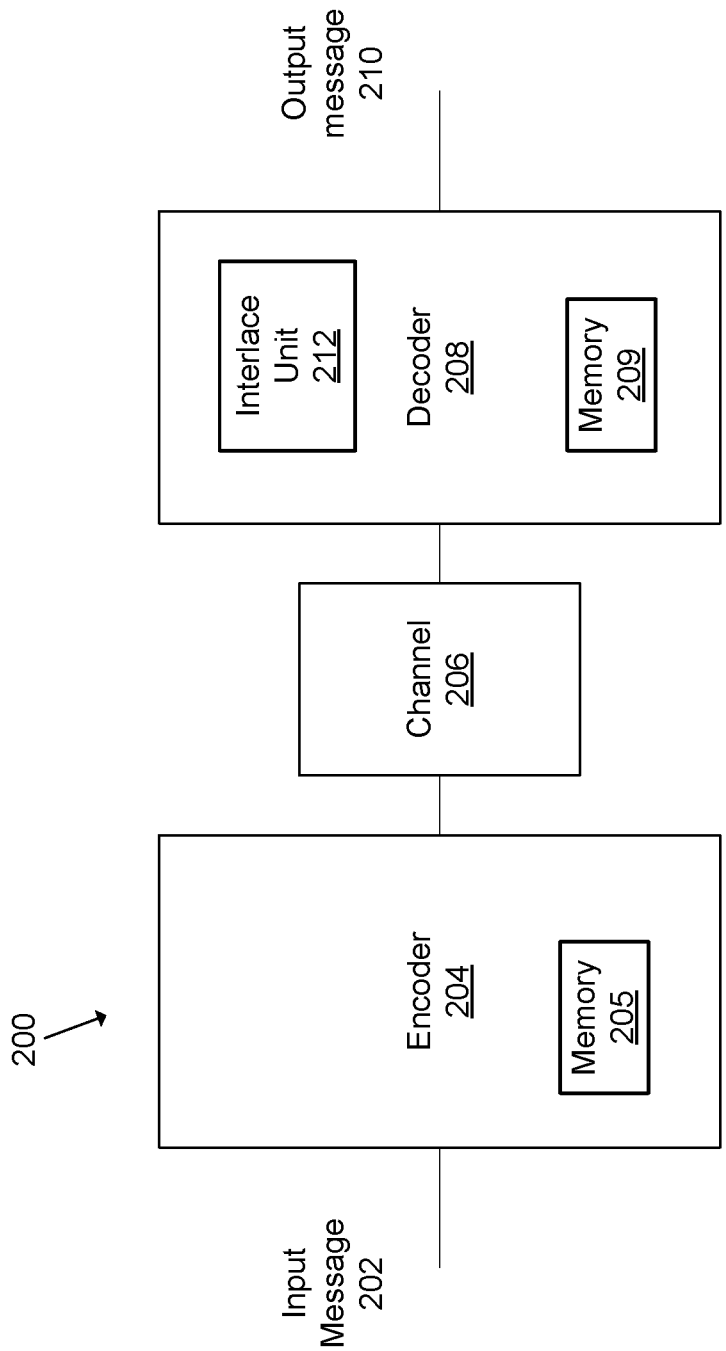
FIG. 2 is a block diagram illustrating an exemplary encoding and/or decoding system according to some embodiments of the present disclosure.

FIG. 2 illustrates an example of an encoding and/or decoding system 200 in which Polar code may be implemented. There, an input message 202 may comprise message data that is input into an encoder 204. The encoder 204 (e.g., a Polar code encoder 204) includes a memory system 205, and may encode the message data using polar code. After the message data is encoded, it may be sent over communication channel(s) 206 (e.g., one or more network channels) to the decoder 208. The decoder 208 includes a memory system 209 and an interlace unit 212. The decoder 208 receives the transmitted encoded message data (also referred to as received codewords), performs a decoding process (e.g., SCL decoding) to decode the received encoded message data, and provides a decoded message data as an output message 210. In some embodiments, the interlace unit 212 of the decoder 208 interlaces multiple codewords of the transmitted encoded message data, and performs a decoding process to the interlaced codewords to improve throughput.

As discussed above, polar codes have various applications, e.g., in 5G networks for various channels. To achieve acceptable bit error rate performance, list decoders (e.g., SCL decoders) may be used. In some examples, a list decoder tracks a list of possible decoding outputs, each of such a list of possible decoding output is also referred to as a "path." During the decoding process, the list decoder associates various values (also referred to as path metric) with each path in the list. These path metric values are operated on twice in a single decoding loop: once to update the path metrics (also referred to as a path metric update operation), and once to perform a sort/cull operation (also referred to as a sort operation).

In some embodiments, the decoder interlaces multiple codewords to improve throughput, where different parts of the decoding loop operate on separate codewords simultaneously. Therefore, in those embodiments, to access a path metric value associated with a given path (among L paths) of a given codeword (among NCW interlaced codewords), the decoder needs to select one of L*NCW path metric values, where L and NCW are positive integers. In some examples, the storage system (e.g., memory system 209) of the decoder includes a register array to access (read or write) those values. In those examples, because there are two read operations (for update and sort operations respectively) and two write operations (for update and sort operations respectively) in a single decoding loop, such a configuration uses too many ports for commonly available RAM elements (e.g., BRAM 103 of FIG. 1) in PLC (e.g., FPGA, ASIC) architectures.

An SCL decoder for polar codes typically requires several stages (e.g., an update stage, a sort stage, other suitable stages, and/or a combination thereof) in a single decoding loop for processing each bit of the codeword, which leads to high latency and inefficient use of the storage system and other hardware elements. Furthermore, in some embodiments, multiple codewords are interlaced to follow one another through the stages (e.g., the update stage, the sort stage) of a decoding loop. Such a combination of multiple paths, multiple codewords, and multiple stages within a decoder loop operating on a common memory (e.g., a single register array) leads to a large resource cost for the access multiplexers for that common memory.

Figure 3:
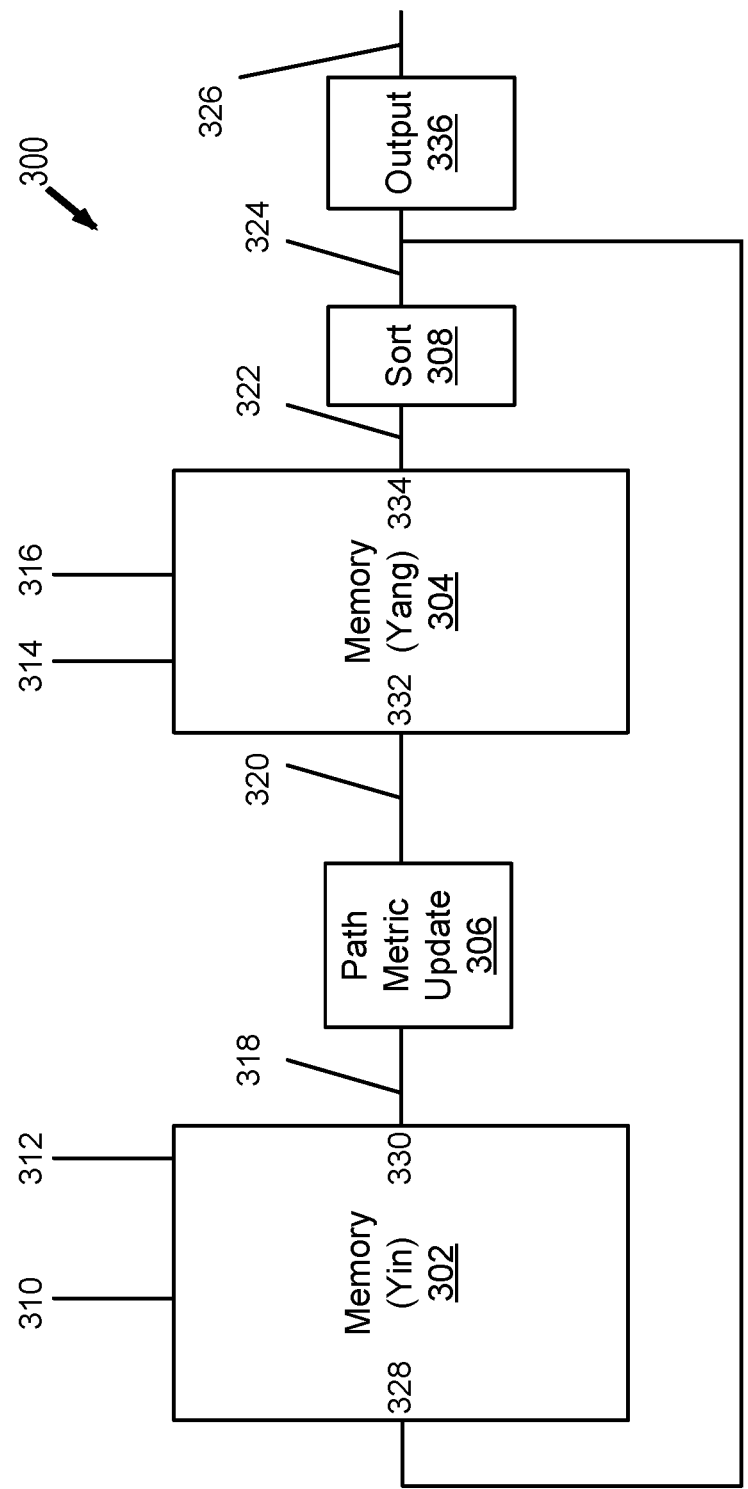
FIG. 3 is a block diagram illustrating an exemplary decoding system or a portion thereof according to some embodiments of the present disclosure.
Figure 4:
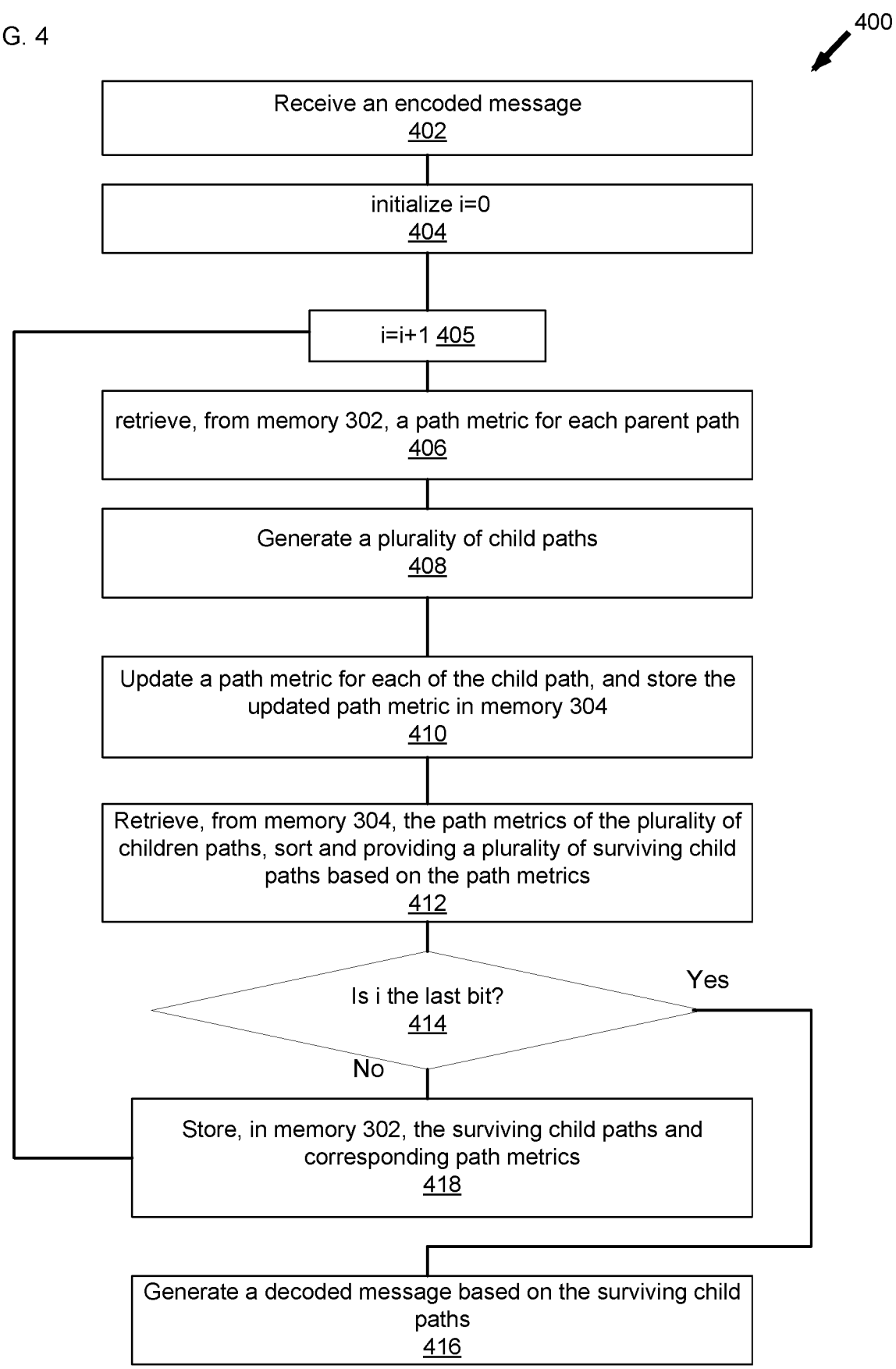
FIG. 4 is a flowchart illustrating an exemplary decoding method using the decoding system of FIG. 3 according to some embodiments of the present disclosure.
Figure 5:
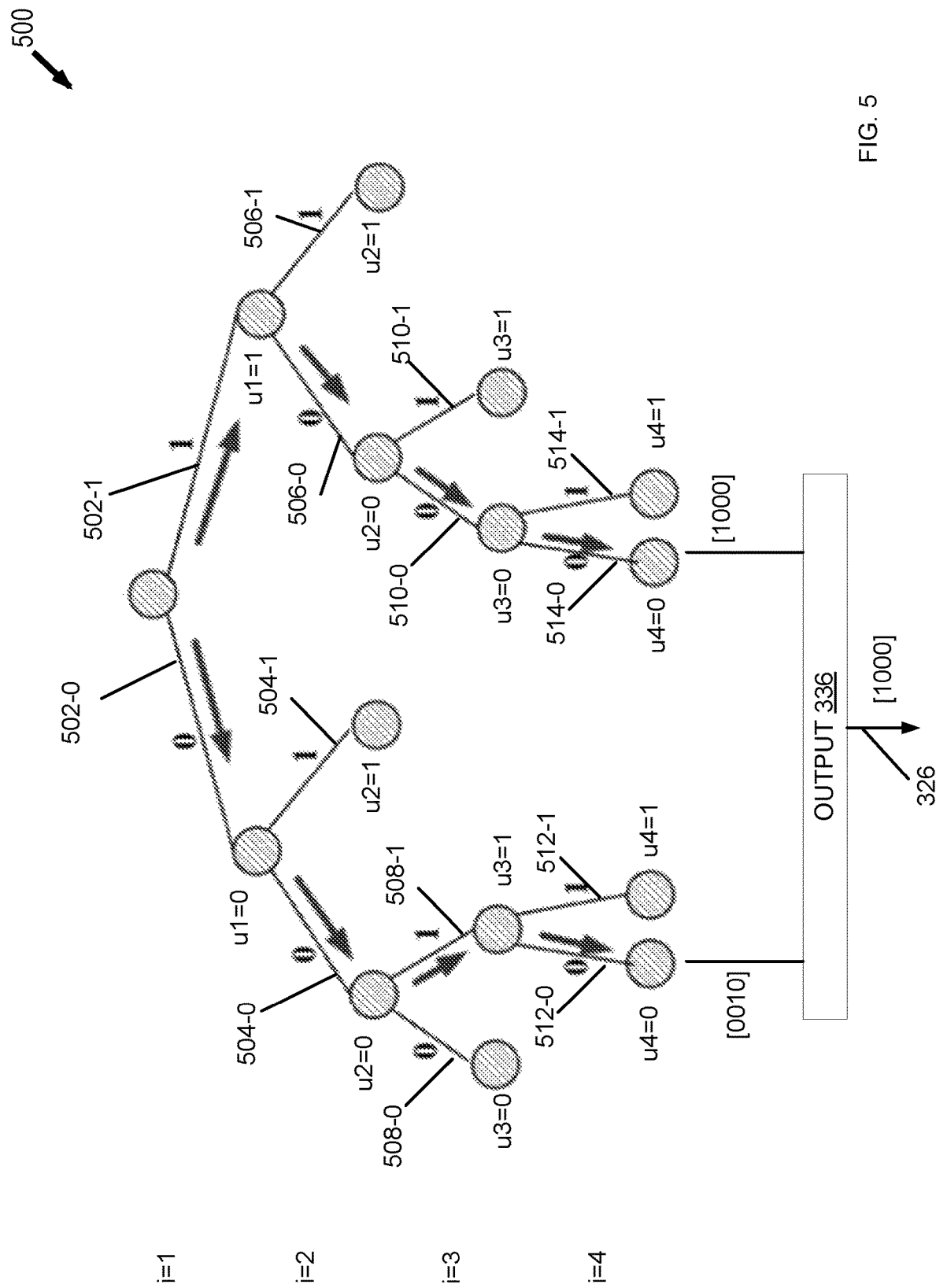
FIG. 5 is a diagram illustrating an exemplary decoding tree using the decoding system of FIG. 3 according to some embodiments of the present disclosure.

Referring to FIGS. 3, 4, and 5 below, systems and methods for SCL decoding for polar codes using a storage system (e.g., memory system 209 of FIG. 2) with two separate memories (e.g., with independent addressing systems) are described. By using two separate memories, the resource cost for multiplexing is reduced, and a more efficient storage system for the SCL decoder is achieved.

Referring to the example of FIG. 3, an SCL decoder 300 for polar codes (e.g., a decoder 208 of FIG. 2) is illustrated. The SCL decoder 300 includes a memory system (e.g., memory system 209 of FIG. 2) including a memory 302 (also referred to as Yin memory 302) and a separate memory 304 (also referred to as Yang memory 304). The memory 302 has a read data port 330 and a write data port 328, which are separate and independent of read data port 334 and write data port 332 of the memory 304. Memory 302 also has write address signal 310 and read address signal 312, which are separate and independent of the write address signal 314 and a read address signal 316 of the second memory 304. In some embodiments, memories 302 and 304 have different sizes. Each of memories 302 and 304 may be implemented using various types of random access memory (RAM), including e.g., one or more BRAM blocks (e.g., BRAM primitives in FPGA), distributed memory blocks (e.g., distributed memory primitives in FPGA), a register array, any other suitable type of RAM, and/or a combination thereof. In an example, memories 302 and 304 include the same type of RAM (e.g., BRAM blocks). In another example, memory 302 include a first type of RAM (e.g., one of BRAM blocks, distributed memory blocks, a register array, etc.), and memory 302 includes a second type of RAM (e.g., another of BRAM blocks, distributed memory blocks, a register array, etc.) that is different from the first RAM.

In embodiments where NCW codewords are interlaced, write address signal 310, read address signal 312, write address signal 314, and write address signal 316 may be used to select a codeword from the NCW codewords interlaced (e.g., 1 codeword from 8 codewords interlaced, where NCW equals 8). The use of separate RAM elements 302 and 304 reduces or eliminates the need for external multiplexing, which saves hardware resource and improves the decoder performance. Furthermore, the use of separate RAM elements 302 and 304 reduces the number of read/write data ports (e.g., a single read data port and a single write data port for each of RAM elements 302 and 304) for the memory system required by the SCL decoder 300. Compared to hardware implementations using a register array to provide a large number of read and write ports, such a reduction to 2 ports for each of memories 302 and 304 allows implementing each of the memories 302 and 304 with one or more two-port RAM primitives (e.g. BRAM) in a programmable logic device, which reduces hardware cost.

As illustrated in FIG. 3, the SCL decoder 300 includes a path metric update circuit 306 and a sort circuit 308. For each decoding loop for decoding a bit in the codeword, the path metric update circuit 306 retrieves parent paths values 318 including, e.g., corresponding path metrics or other path state values from a read data port 330 of the memory 302, generate child path values 320 including corresponding path metrics, and provides the child path values 320 to a write data port 332 of the memory 304. The memory 304 stores the child path values 320.

In the example of FIG. 3, the sort circuit 308 retrieves child path values 322 from a read data port 334 of the memory 304, performs a sort operation to the child path values 322 (e.g., based on the corresponding path metrics), and generates surviving child path values 324 by selecting the surviving child paths from the child path values 322 based on the sort operation. If the current bit of the codeword of the decoding loop iteration is the last bit of the codeword, then sorted child path values 324 are provided as an output of the SCL decoder 300. Otherwise, sorted child path values 324 including the child path metrics are provided to a write data port 328 of the memory 302, where the memory 302 stores sorted surviving child path values 324, which will be retrieved as the parent path metrics for the next decoding loop iteration for the next bit of the codeword. The surviving child paths become the parent paths of the next decoding loop iteration for the subsequent bit.

Referring to FIG. 4, a decoding method 400 using the SCL decoder 300 of FIG. 3 is illustrated. The method 400 starts at block 402, where the SCL decoder 300 receives an encoded message (e.g., an N-bit codeword encoded with polar code). It is noted that while in the examples below, a list size L of 2 and a codeword length N of 4 are used for the SCL decoder 300, each of L and N may be any suitable integer.

The method 400 proceeds to block 404, where an index i is initialized to 0. The method 400 proceeds to block 405, where the index i is increased by one, and begins the decoding loop for the $i^{th}$ bit of the codeword.

The method 400 proceeds to block 406, where path metric update circuit 306 retrieves, from memory 302, path metrics for parent paths. Referring to FIG. 5, in the decoding tree 500, when the index i equals 1, there are no parent paths, and as such, no path metrics are retrieved from memory 302.

The method 400 proceeds to block 408, where path metric update circuit 306 generates a plurality of child paths. In the example of FIG. 5, when index i equals 1, the path metric update circuit 306 generates child paths 502-0 and 502-1, corresponding to possible bit values "0" and "1" for the $1^{st}$ bit of the codeword respectively.

The method 400 proceeds to block 410, where path metric update circuit 306 updates path metrics for child paths 502-0 and 502-1 respectively. Various types of path metrics, including e.g., log-likelihood ratio (LLR)-based path metrics, may be used. The path metrics may be determined based on various path state information, including e.g., the state of cyclic redundancy check (CRC) decode (e.g., a 24-bit CRC for 5G downlink), parity state (a 5-bit parity state for 5GT uplink), a part of the path itself, etc.

At block 410, the path metric update circuit 306 provides the updated path metrics for child paths 502-0 and 502-1 to a write data port of memory 304, and memory 304 stores those updated path metrics for child path 502-0 and 502-1.

The method 400 proceeds to block 412, where sort circuit 308 retrieves, from a read data port 334 of memory 304, the path metrics for child paths (e.g., child path 502-0 and 502-1). Sort circuit 308 performs a sort operation based on the corresponding paths metrics and select a number of surviving child paths 324 based on the sorting (e.g., based on the greatest LLR-based paths metrics). As shown in FIG. 5, when index i equals 1, surviving child paths 324 includes child paths 502-0 and 502-1. In the decoding loop for the 1st bit, because the number of child paths does not exceed the list number L, no selection is performed, and the surviving child paths 324 is the same as the child paths 320.

The method 400 proceeds to block 414, where the SCL decoder 300 (e.g., using a processing unit) determines whether the index i reaches the last bit of the codeword. If it is determined that index i has reached the last bit, then the method 400 proceeds to block 416, where an output unit 336 of the SCL decoder 300 (e.g., output unit 336 of FIGS. 3 and 5) generate the decoded message 326 based on at least one of the surviving paths of the decoding tree 500.

In some embodiments, after at block 414 it determined that the index i with a value of 1 does not reach the last bit of the codeword, the method 400 proceeds to block 418, where the sort unit 308 provides data of the surviving child paths 324, including the corresponding path metrics, to write data port 328 of memory 302. Memory 302 stores the data of the surviving child paths 324 including the corresponding path metrics. The method 400 proceeds to block 405 to increase the value of the index i by 1, and continues with a decoding loop (blocks 406 through 420) for the next bit ($2^{nd}$ bit).

As shown in the example of FIG. 5, the decoding loop for the $2^{nd}$ bit is performed when index i equals 2. At block 406, path metric update circuit 306 retrieves, from memory 302, path metrics for parent paths 502-0 and 502-1. At block 408, path metric update circuit 306 generates child paths 504-0 and 504-1 from parent path 502-0, corresponding to possible bit values "0" and "1" for the $2^{nd}$ bit of the codeword respectively. Path metric update circuit 306 also generates child paths 506-0 and 506-1 from parent path 502-1, corresponding to possible bit values "0" and "1" for the $2^{nd}$ bit of the codeword respectively. At block 410, path metric update circuit 306 updates path metrics for the child paths (e.g., child paths 504-0, 504-1, 506-0, and 506-1) respectively. Path metric update circuit 306 provides the updated path metrics for the child paths to a write data port of memory 304, and memory 304 stores those updated path metrics for those child paths.

During the decoding loop for the $2^{nd}$ bit, at block 412, sort circuit 308 retrieves, from a read data port 334 of memory 304, the child path metrics for child paths 504-0, 504-1, 506-0, and 506-1. Sort circuit 308 performs a sort operation based on the corresponding paths metrics and select surviving child paths 324 based on the sorting (e.g., based on the L best LLR-based paths metrics). In the example of FIG. 5, surviving child paths 324 includes child paths 504-0 and 506-0 (e.g., based on the L best LLR path metrics of child paths 504-0, 504-1, 506-0, and 506-1).

It is noted that in an SCL decoder, not every decoded loop requires a sort operation, because for some bit positions, the value of the bit is known a-priori (e.g., a frozen bit according to some predefined codes). For such bit positions, although a sort operation is not required, the transfer of information 322 from memory 304 to memory 302 still occurs, so that the effect of the update circuit 306 is held in memory 302 for the next loop iteration. Such a transfer without a sort operation is relatively trivial, because the paths do not swap positions (e.g., pointer addresses) as performed with a sort operation. In other words, when the bit position is a known-value bit, for each parent path, only one child path (with the known value for that bit) is generated which inherit its parent path's information, and as such, no sort/cull operations are performed.

The method 400 proceeds to block 414, where the SCL decoder 300 (e.g., using a processing unit) determines that the index i with a value of 2 does not reach the last bit of the codeword, the method 400 proceeds to block 418, where the sort unit 308 provides data of the surviving child paths 324, including the corresponding path metrics, to write data port 328 of memory 302. Memory 302 stores the data of the surviving child paths 324 including the corresponding path metrics (e.g., child paths 504-0 and 506-0 with corresponding path metrics). The method 400 proceeds to block 405 to increase the value of the index i by 1, and continues with a decoding loop (blocks 406 through 420) for the next bit ($3^{rd}$ bit). As discussed in detail below, in the decoding loop for the next bit, these surviving child paths 324 (with their path metrics) of the decoding loop for the $2^{nd}$ bit are retrieved from the memory 302 and become the parent paths in the decoding loop for the $3^{rd}$ bit.

As shown in the example of FIG. 5, the decoding loop for the 3rd bit is performed when index i equals 3. At block 406, path metric update circuit 306 retrieves, from memory 302, path metrics for parent paths 504-0 and 506-0 for the 3rd bit decoding. At block 408, path metric update circuit 306 generates child paths 508-0 and 508-1 from parent path 504-0, corresponding to possible bit values "0" and "1" for the 3rd bit of the codeword respectively. Path metric update circuit 306 also generates child paths 510-0 and 510-1 from parent path 506-0, corresponding to possible bit values "0" and "1" for the $3^{rd}$ bit of the codeword respectively. At block 410, path metric update circuit 306 updates path metrics for the child paths (e.g., child paths 508-0, 508-1, 510-0, and 510-1) respectively. Path metric update circuit 306 provides the updated path metrics for the child paths to a write data port of memory 304, and memory 304 stores those updated path metrics for those child paths.

During the decoding loop for the $3^{rd}$ bit, at block 412, sort circuit 308 retrieves, from a read data port 334 of memory 304, the child path metrics for child paths 508-0, 508-1, 510-0, and 510-1. Sort circuit 308 performs a sort operation based on the corresponding paths metrics and select surviving child paths 324 based on the sorting (e.g., based on the L best LLR-based paths metrics). In the example of FIG. 5, surviving child paths 324 includes child paths 508-1 and 510-0 (e.g., with the L best LLR path metrics among child paths 508-0, 508-1, 510-0, and 510-1).

The method 400 proceeds to block 414, where the SCL decoder 300 (e.g., using a processing unit) determines that the index i with a value of 3 does not reach the last bit of the codeword, the method 400 proceeds to block 418, where the sort unit 308 provides data of the surviving child paths 324, including the corresponding path metrics, to write data port 328 of memory 302. Memory 302 stores the data of the surviving child paths 324 including the corresponding path metrics (e.g., child paths 508-1 and 510-0 with corresponding path metrics). The method 400 proceeds to block 405 to increase the value of the index i by 1, and continues with a decoding loop (blocks 406 through 420) for the next bit (4th bit).

As shown in the example of FIG. 5, the decoding loop for the 4th bit is performed when index i equals 4. At block 406, path metric update circuit 306 retrieves, from memory 302, path metrics for parent paths 508-1 and 510-0 for the 4th bit decoding. At block 408, path metric update circuit 306 generates child paths 512-0 and 512-1 from parent path 508-1, corresponding to possible bit values "0" and "1" for the 4th bit of the codeword respectively. Path metric update circuit 306 also generates child paths 514-0 and 514-1 from parent path 510-0, corresponding to possible bit values "0" and "1" for the $4^{th}$ bit of the codeword respectively. At block 410, path metric update circuit 306 updates path metrics for the child paths (e.g., child paths 512-0, 512-1, 514-0, and 514-1) respectively. Path metric update circuit 306 provides the updated path metrics for the child paths to a write data port of memory 304, and memory 304 stores those updated path metrics for those child paths.

During the decoding loop for the $4^{th}$ bit, at block 412, sort circuit 308 retrieves, from a read data port 334 of memory 304, the child path metrics for child paths 512-0, 512-1, 514-0, and 514-1. Sort circuit 308 performs a sort operation based on the corresponding paths metrics and select surviving child paths 324 based on the sorting (e.g., based on the L best LLR-based paths metrics). In the example of FIG. 5, for the $1^{st}$ path 501-1, surviving child paths 324 includes child paths 512-0 and 514-0 (surviving child paths 324 includes child paths 508-1 and 510-0 (e.g., with the L best LLR path metrics among child paths 512-0, 512-1, 514-0, and 514-1).

The method 400 proceeds to block 414, where the SCL decoder 300 (e.g., using a processing unit) determines that the index i with a value of 4 reaches the last bit of the codeword. The method 400 proceeds to block 416, where output unit 336 of the SCL decoder 300 (e.g., output unit 336 of FIGS. 3 and 5) generate the decoded message 326 based on the surviving paths of the decoding tree 500. In the example of FIG. 5, a first list includes surviving paths 502-0, 504-0, 508-1, and 512-0 for the corresponding first through fourth bits of the codeword, and corresponds to a decoded message [0010]. A second list includes surviving paths 502-1, 506-0, 510-0, and 514-0 for the corresponding first through fourth bits of the codeword, and corresponds to a decoded message [1000]. The output 336 determines an output decoded message 326 (e.g., [1000]), e.g., based on the LLR path metrics of child paths 512-0 and 514-0.

In some embodiments, the SCL decoding system and method of FIGS. 3, 4, and 5 are performed with one or more of the following conditions: Condition I: The update and sort operations are mutually exclusive in time. Condition II: With the codeword interlacing implementation, each of the two operations can only apply to one codeword at a time. Condition III: Each decoding loop includes read and write accesses to each of memories 302 and 304. In an example where a sort operation is not required for a particular bit position (e.g., with a priori known value), the read and write accesses to each of memories 302 and 304 are still performed.

Figure 6:
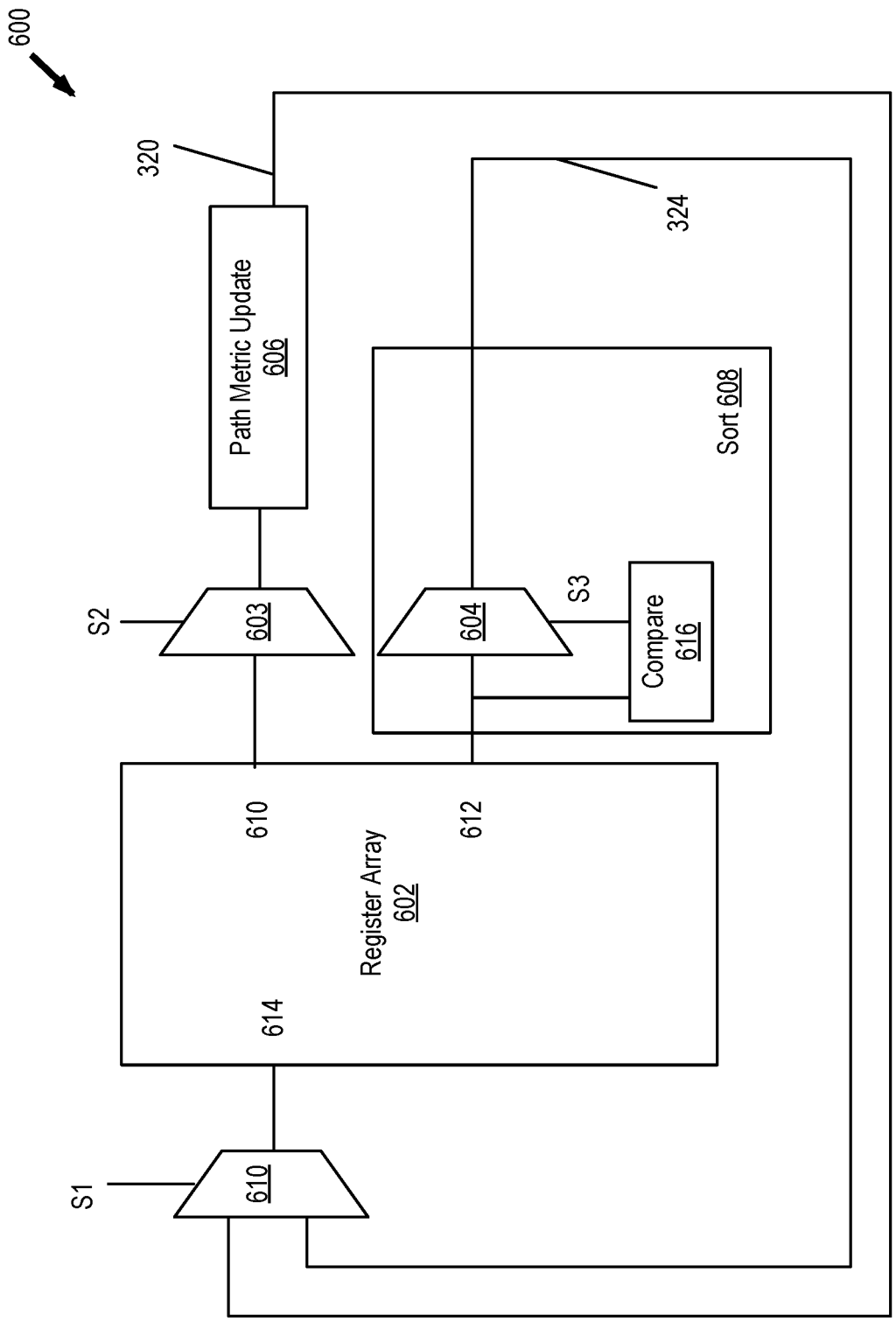
FIG. 6 is a block diagram illustrating an exemplary decoding system or a portion thereof according to some embodiments of the present disclosure.

Referring to FIG. 6, illustrated is an exemplary decoding system 600 or a portion thereof using the same memory for both the update operation and the sort operation. As discussed in detail below, compared to the decoding system 300 described in FIGS. 3-5 that uses separate memories for the update and sort stages, the decoding system 600 uses the same memory (with a single memory address system) for the update and sort stages in the decoding loop, which requires more hardware (e.g., multiplexers), uses more read and write data ports of the memory, and is less efficient.

As shown in the example of FIG. 6, the decoding system 600 includes a single memory 602 (e.g., a register array) used by both the path metric update circuit 606 and the sort circuit 608. Multiplexor block 603 is coupled between read data ports 610 of the memory 602 and an input of the path metric update circuit 606, and are used to select parent path values associated with a particular path of a particular codeword of multiple interlaced codewords. As such, the multiplexer block 603 is used to select one value from L*NCW inputs. The L*NCW inputs are read from read data ports 610 (e.g., L*NCW read data ports) respectively, where L is the list size (number of paths) and NCW is the number of interlaced codewords.

In the example of FIG. 6, the sort circuit 608 includes a compare unit 616 and a multiplexer block 604. The compare unit 616 receives the child paths including corresponding child path state values (e.g., path metrics or other child path state values including e.g. parity state or CRC state) from the memory 602 (through a read data port 612), determines the path metrics from the child path state values if needed, compares the path metrics, and determines the L best path metrics for L surviving child paths. The multiplexer block 604 receives the child paths from the read data port 612 of the memory 602 and a selection signal s3 from the compare unit 616 for selecting the L surviving child paths. The multiplexer block 604 is used to select L value from 2*L*NCW inputs, read from read data ports 612 (using L*NCW read data ports) respectively.

As shown in the example of FIG. 6, the path metric update circuit 606 provides child paths 320 with corresponding path metrics to an input of a multiplexer 610, and the sort circuit 608 provides surviving child paths 324 with corresponding path metrics to another input of the multiplexer 610. The multiplexer 610 selects the value to be written to the register array 602 using a write data port 614.

In the example of FIG. 6, the register array 602 stores an N1-bit path metric for each path of each codeword, and as such, requires N1*L*NCW registers, where N1 is the bit number for each path metric, L is the list size (number of paths), and NCW is the number of interlaced codewords. To perform the update operation by the path metric update circuit 606, the path metric update circuit 606 uses the multiplexer block 603 to select the L values (one per path) for the codeword. As such, multiplexer block 603 includes L*N1 NCW*L:1 multiplexers. Since the path metric update circuit 606 receives L parent paths as input, and produces values for child paths with both possible values of "0" and "1", the path metric update circuit 606 provides 2L child paths as output for each bit in the codeword.

In the example of FIG. 6, for the sort operation, the path metrics may be simply copied from the register array to another position in the register array 602 Although the multiplexer block 604 associated with selection signal S3 selects the codeword to operate on and the sort operation produces L values from the 2L inputs, S3 and the sort operation may be considered as one larger multiplexer of NCW*2*L to 1. Because the sort circuit produces L*N1 bit values, the multiplexer block 604 includes L*R*N1 NCW*L*R:1 multiplexers, where R is the number of child paths per parent path (e.g., R=2). In an example, path state information (e.g., parity state) that may be used to determine path metrics is stored, and in that example, N1 is the width of the path state information. In that example, path metrics may be computed based on the path state information retrieved from the memory.

In the example of FIG. 6, selection signal S1 of multiplexer block 610 selects data to write to any register in the register array 602 between child path values 320 and surviving child path values 324. As such, there is an independent S1 signal for each codeword in the register array 602. While a single 2:1 multiplexer 610 is illustrated in FIG. 6, for each register in the register array 602, there is a multiplexer 610. Note that the operations of multiplexer block 603 and update operation performed by the path metric update circuit 606, the sort operation performed by the sort circuit 608 and the operations of multiplexer block 604, and the operation of multiplexer 610 are performed in series.

Compared to the decoding system 600 using a single memory 602 for both update and sort operations, the decoding system 300 uses two separate memories 302 and 304 for providing data to the update and sort operations respectively. As such, no output multiplexer (e.g., multiplexer 603 of FIG. 6) is required at the read data port 330 of memory 302 to provide data 318 to the path metric update circuit 306. Furthermore, in the decoding system 300, because the write data ports to memories 302 and 304 are dedicated to the sort operation and the update operation respectively, no input multiplexer (e.g., multiplexer 610 of FIG. 6) is required at the write data ports 328 and 332 of the memories 302 and 304. Furthermore, in the sort circuit 308, because the selection of interlaced codeword (1 from NCW) is already performed within the memory 304 by the read address signal 316, the sort circuit only requires N1 2L:1 multiplexers.

Furthermore, the decoding system 300 requires a smaller storage size. For example, the decoding system 600 requires that the register array 602 to include N1*NCW*L*2 registers. In the decoding system 300, memory 302 may be implemented with N1*L registers (e.g., together with N1*L LUTs), and memory 304 may be implemented with N1*L*2 registers (e.g., together with N1*L*2 LUTs).

It is noted that various configurations illustrated in FIGS. 2-6 are exemplary only and not intended to be limiting beyond what is specifically recited in the claims that follow. It will be understood by those skilled in that art that other configurations (e.g., different values for L, N1, NCW, etc.) may be used. For example, while in the described example a single decoding loop decodes 1 bit, in some embodiments, two or more bits may be decoded during a single decoding loop. In an example where two bits are decoded during a single decoding loop, four possible children paths for the two bits may be generated from a single parent path. Further, separate memories for separate stages of a loop may be used in data processing circuits in addition to decoding circuits, where data processed by the loop is operated on more than once in the loop, and Conditions I, II, and/or III are met. In various embodiments, various types of path state information may be used to determine the path metrics. In some embodiments where polar code is used in 5G network, the path state information may include, for example, parity information for uplink and cyclic redundancy check (CRC) state information for downlink. While in some embodiments path metrics are stored in the memories, in alternative embodiments, various path state information is stored in the memories, and path metrics may be determined based on the path state information retrieved from the memories.

One or more elements in the various embodiments may be implemented by software, hardware (e.g., an application specific integrated circuit (ASIC), application-specific standard parts (ASSPs), a logic on a programmable logic IC (e.g., FPGA)), firmware, and/or a combination thereof. The embodiments may be implemented using various hardware resources, such as for example DSP slices, BRAM, and programmable resources of an FPGA; however, in other embodiments, digital signal processors, microprocessors, multi-core processors, memory, and/or other hardware may be used. When implemented in software, the elements of the embodiments of the invention are essentially the code segments to perform the necessary tasks. The program or code segments can be stored in a processor-readable storage medium or device that may have been downloaded by way of a computer data signal embodied in a carrier wave over a transmission medium or a communication link. The processor readable storage device may include any medium that can store information including an optical medium, semiconductor medium, and magnetic medium. Processor readable storage device examples include an electronic circuit; a semiconductor device, a semiconductor memory device, a read-only memory (ROM), a flash memory, an erasable programmable read-only memory (EPROM); a floppy diskette, a CD-ROM, an optical disk, a hard disk, or other storage device. The code segments may be downloaded via computer networks such as the Internet, Intranet, etc.

Although particular embodiments have been shown and described, it will be understood that it is not intended to limit the claimed inventions to the preferred embodiments, and it will be obvious to those skilled in the art that various changes and modifications may be made without departing from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. A decoder circuit, comprising:
   an input configured to receive an encoded message;
   a decoding loop circuit including first and second memories, an update circuit, and a sort circuit;
   wherein the decoding loop circuit is configured to:
      perform list decoding to the encoded message by successively decoding a plurality of bits of a first codeword of the encoded message in a plurality of decoding loops respectively; and
      provide, to an output, a decoded message based on at least one of a plurality of surviving child path values;
   wherein in each decoding loop for a corresponding bit of the first codeword:
      the update circuit is configured to:
         receive, from the first memory, a plurality of parent path values; and
         provide, to a second memory, a plurality of child path values based on the plurality of parent path values; and
      the sort circuit is configured to:
         receive, from the second memory, the plurality of child path values; and
         provide, to the first memory, the plurality of surviving child path values based on the plurality of child path values.

2. The decoder circuit of claim 1, wherein the first memory has a first size that is different from a second size of the second memory.

3. The decoder circuit of claim 1, wherein each of the first and second memories include one or more random access memory blocks (BRAMs) in a programmable logic device.

4. The decoder circuit of claim 1, wherein the first memory includes a first type of random access memory (RAM), and
   wherein the second memory includes a second type of random access memory that is different from the first type.

5. The decoder circuit of claim 1, wherein the decoding loop circuit is configured to decode a plurality of interlaced codewords of the encoded message.

6. The decoder circuit of claim 1, wherein the encoded message is generated based on a polar code.

7. The decoder circuit of claim 1, wherein the list decoding is successive cancellation list decoding.

8. The decoder circuit of claim 1, wherein the plurality of child path values include corresponding path metrics for each path.

9. The decoder circuit of claim 1, wherein the first memory includes a read data port directly connected to an input of the update circuit.

10. The decoder circuit of claim 1, wherein the second memory includes a write data port directly connected to an output of the update circuit.

11. A method, comprising:
    receiving an encoded message;
    performing list decoding of the encoded message by successively decoding a plurality of bits of a first codeword of the encoded message in a plurality of decoding loops respectively, wherein each decoding loop for a corresponding bit of the first codeword includes:
       receiving, by an update circuit from a first memory, a plurality of parent path values;
       providing, by the update circuit to a second memory, a plurality of child path values based on the plurality of parent path values;
       receiving, by a sort circuit from the second memory, the plurality of child path values; and
       providing, by the sort circuit to the first memory, a plurality of surviving child path values based on the plurality of child path values; and
    providing, to an output, a decoded message based on at least one of the plurality of surviving child path values.

12. The method of claim 11, wherein the first memory has a first size that is different from a second size of the second memory.

13. The method of claim 11, wherein each of the first and second memories include one or more random access memory blocks (BRAMs) in a programmable logic device.

14. The method of claim 11, wherein the first memory includes a first type of random access memory (RAM), and
    wherein the second memory includes a second type of random access memory that is different from the first type.

15. The method of claim 11, further comprising:
    generating a plurality of interlaced codewords of the encoded message; and
    performing the list decoding to the plurality of interlaced codewords.

16. The method of claim 11, wherein the encoded message is generated based on a polar code.

17. The method of claim 11, wherein the list decoding is successive cancellation list decoding.

18. The method of claim 11, wherein the plurality of child path values include corresponding path metrics for each path.

19. The method of claim 11, wherein the update circuit receives the plurality of parent path values from the first memory using a read data port of the first memory directly connected to an input of the update circuit.

20. The method of claim 11, wherein the update circuit provides the plurality of child path values to the second memory using a write data port of the second memory directly connected to an output of the update circuit.

* * * * *